(12) United States Patent
Xu

(10) Patent No.: US 10,477,735 B2
(45) Date of Patent: Nov. 12, 2019

(54) HEAT DISSIPATION SYSTEM FOR USE WITH LIQUID CRYSTAL TELEVISION AND LIQUID CRYSTAL TELEVISION

(71) Applicant: Shenzhen China Star Optoelectronics Technology Co., Ltd., Shenzhen (CN)

(72) Inventor: Xiaojie Xu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 249 days.

(21) Appl. No.: 15/539,699

(22) PCT Filed: Jun. 14, 2017

(86) PCT No.: PCT/CN2017/088192
§ 371 (c)(1),
(2) Date: Jun. 26, 2017

(87) PCT Pub. No.: WO2018/196120
PCT Pub. Date: Nov. 1, 2018

(65) Prior Publication Data
US 2018/0317349 A1    Nov. 1, 2018

(30) Foreign Application Priority Data

Apr. 28, 2017   (CN) .......................... 2017 1 0295460

(51) Int. Cl.
*H05K 7/20*       (2006.01)
*F21V 8/00*       (2006.01)
*G02F 1/1333*     (2006.01)

(52) U.S. Cl.
CPC ....... *H05K 7/20972* (2013.01); *G02B 6/0085* (2013.01); *G02F 1/133308* (2013.01);
(Continued)

(58) Field of Classification Search
CPC ..................... G02B 6/0085; H05K 7/20963
See application file for complete search history.

(56) References Cited

U.S. PATENT DOCUMENTS

2004/0264130 A1    12/2004  Liang
2007/0211205 A1*    9/2007  Shibata ............. G02F 1/133603
                                                              349/161
2016/0198589 A1*    7/2016  Kang ................ G02F 1/133385
                                                              361/692

FOREIGN PATENT DOCUMENTS

CN    2681336 Y     2/2005
CN    101865389 A   10/2010
(Continued)

*Primary Examiner* — Edmond C Lau
(74) *Attorney, Agent, or Firm* — Leong C. Lei

(57) ABSTRACT

The present invention provides a heat dissipation system for use with a liquid crystal television and a liquid crystal television. The heat dissipation system for use with a liquid crystal television is structured such that a heat spreader (4) having high thermal conductivity is adhesively mounted to a shaped heat-dissipating member (1) and is operated in combination with heat-dissipating fins (5) and fans (6), wherein the heat spreader (4) functions as a core heat transfer medium in the entire heat dissipation system to help greatly reduce a temperature gradient and to remove heat from an LED light bar (2) in a quick, massive, and efficient manner so as to prevent the LED light bar (2) from burning down or shortening of service life due to excessive high temperature. Further, due to the arrangement of the heat spreader (4), the size of the shaped heat-dissipating member (1) can be reduced thereby helping thinning of the liquid crystal television.

15 Claims, 4 Drawing Sheets

(52) U.S. Cl.
 CPC ... *G02F 1/133385* (2013.01); *H05K 7/20963* (2013.01); *F28F 2215/00* (2013.01); *G02F 2001/133314* (2013.01)

(56) References Cited

FOREIGN PATENT DOCUMENTS

| | | |
|---|---|---|
| CN | 201606844 U | 10/2010 |
| CN | 202118707 U | 1/2012 |
| CN | 102563459 A | 7/2012 |
| CN | 202691977 U | 1/2013 |
| CN | 103899976 A | 7/2014 |
| CN | 105650566 A | 6/2016 |
| KR | 20090119405 A | 11/2009 |

\* cited by examiner

HEAT DISSIPATION SYSTEM FOR USE WITH LIQUID CRYSTAL TELEVISION AND LIQUID CRYSTAL TELEVISION

BACKGROUND OF THE INVENTION

1. Field of the Invention

The present invention relates to the field of liquid crystal displays, and more particular to a heat dissipation system for use with a liquid crystal television and a liquid crystal television.

2. The Related Arts

Liquid crystal display (LCD) has various advantages, such as thin device body, lower power consumption, and being free of radiation, and has been widely used in for example liquid crystal televisions, smart phones, computer displays, and notebook computer screens.

Most of the LCDs that are currently available in the market are backlighting LCDs, which comprise an enclosure, a liquid crystal panel mounted in the enclosure, and a backlight module mounted in the enclosure.

The liquid crystal panel does not emit light by itself and light must be provided from the backlight module in order to normally display an image. The backlight modules can be classified in two types, namely a side-edge backlight module and a direct backlight module, according to the site where light gets incident. The direct backlight module comprises a light source, such as a cold cathode fluorescent lamp (CCFL) or a light-emitting diode (LED), which is arranged at the backside of the liquid crystal panel to form a planar light source directly supplied to the liquid crystal panel. The side-edge backlight module comprises an LED light bar, which is arranged rearward of one side of the liquid crystal panel to emit light that enters a light guide plate (LGP) through a light incident surface at one side of the light guide plate and is subjected to reflection and diffusion to project outward through a light exit surface of the light guide plate, and further passing through an optical film assembly, to form a backlighting source supplied to the liquid crystal panel.

Heretofore, liquid crystal televisions generally adopt side-edge lighting to suit the need for an ultrathin thickness. A major issue of the side-edge lighting is that the density of LED beads arranged on the LED light bar is extremely large so that temperature at the light incident side is excessively high. The severity of the temperature problem of the light incidence side is even worse for the liquid crystal televises of which development is made in a direction toward high brightness and high image quality.

Liquid crystal televisions that are currently available often use aluminum extrusions as heat dissipation components and heat dissipation relies on natural heat transfer through the aluminum extrusions, such that a heat transfer passage is from an LED to the aluminum extrusion and then to surrounding air. Although the aluminum extrusion has a simple structure, the inherent heat dissipation capability based on natural heat transfer is very limited and may not suit for the need of heat dissipation of liquid crystal televisions of new types. Directly enlarging an area of the aluminum extrusion for the purpose of increasing heat dissipation performance would increase the thickness of a lower portion of the liquid crystal television on the one hand, and on the other hand, an enlarged aluminum extrusion implies an increased gradient of temperature, meaning the temperature of a lower portion of the aluminum extrusion that is close to the LED light bar is very high and the temperature get lower as the location is higher. In other words, heat dissipation induced by expanding the area of the aluminum extrusion is in fact very limited.

Thus, it is desired to provide a heat dissipation system that is novel and suits the current configuration of liquid crystal televisions.

SUMMARY OF THE INVENTION

An objective of the present invention are to provide a heat dissipation system for use with a liquid crystal television, which allows for faster and more efficient dissipation of heat from a light-emitting diode (LED) light bar and helps thinning the liquid crystal television.

Another objective of the present invention is to provide a liquid crystal television that has a heat dissipation system having a high heat dissipation efficiency and excellent heat dissipation performance.

To achieve the above objectives, the present invention provides a heat dissipation system for use with a liquid crystal television, which comprises a shaped heat-dissipating member, an LED light bar adhesively mounted to a horizontal bottom wall of the shaped heat-dissipating member, a back board arranged between the LED light bar and an inner vertical surface of the shaped heat-dissipating member to receive the shaped heat-dissipating member to fix thereto, a heat spread adhesively mounted to an outer vertical surface of the shaped heat-dissipating member, heat-dissipating fins mounted to one side of the heat spreader that is distant from the shaped heat-dissipating member, and a plurality of fans mounted to one side of the heat-dissipating fins that is distant from the heat spreader.

The shaped heat-dissipating member comprises an aluminum extrusion member or a shaped copper member.

The heat spreader comprises a thin plate having a hollowed interior.

The interior of the heat spreader is evacuated and vacuumed.

The heat spreader is provided, in the interior thereof, with miniature network structures or a multiple-pore structure.

The interior of the heat spreader is filled with a coolant.

The coolant comprises alcohol or clean water.

The heat spreader is made of a material comprising copper.

The heat spreader casts a projection area on the back board is greater than a projection area cast on the back board by the shaped heat-dissipating member and the heat spreader has a height that is greater than a height of the shaped heat-dissipating member.

The present invention also provides a liquid crystal television, which comprises the heat dissipation system for use with a liquid crystal television described above.

The present invention further provides a heat dissipation system for use with a liquid crystal television, which comprises a shaped heat-dissipating member, an LED light bar adhesively mounted to a horizontal bottom wall of the shaped heat-dissipating member, a back board arranged between the LED light bar and an inner vertical surface of the shaped heat-dissipating member to receive the shaped heat-dissipating member to fix thereto, a heat spread adhesively mounted to an outer vertical surface of the shaped heat-dissipating member, heat-dissipating fins mounted to one side of the heat spreader that is distant from the shaped heat-dissipating member, and a plurality of fans mounted to one side of the heat-dissipating fins that is distant from the heat spreader;

wherein the shaped heat-dissipating member comprises an aluminum extrusion member or a shaped copper member; and wherein the heat spreader comprises a thin plate having a hollowed interior.

The efficacy of the present invention is that the present invention provides a heat dissipation system for use with a liquid crystal television, in which a heat spreader having high thermal conductivity is adhesively mounted to a shaped heat-dissipating member and is operated in combination with heat-dissipating fins and fans, wherein the heat spreader functions as a core heat transfer medium in the entire heat dissipation system to help greatly reduce a temperature gradient and to remove heat from an LED light bar in a quick, massive, and efficient manner so as to prevent the LED light bar from burning down or shortening of service life due to excessive high temperature. Further, due to the arrangement of the heat spreader, the size of the shaped heat-dissipating member can be reduced thereby helping thinning of the liquid crystal television. The present invention provides a liquid crystal television, which comprises the above heat dissipation system for use with a liquid crystal television and shows high heat dissipation efficiency and good heat dissipation performance.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
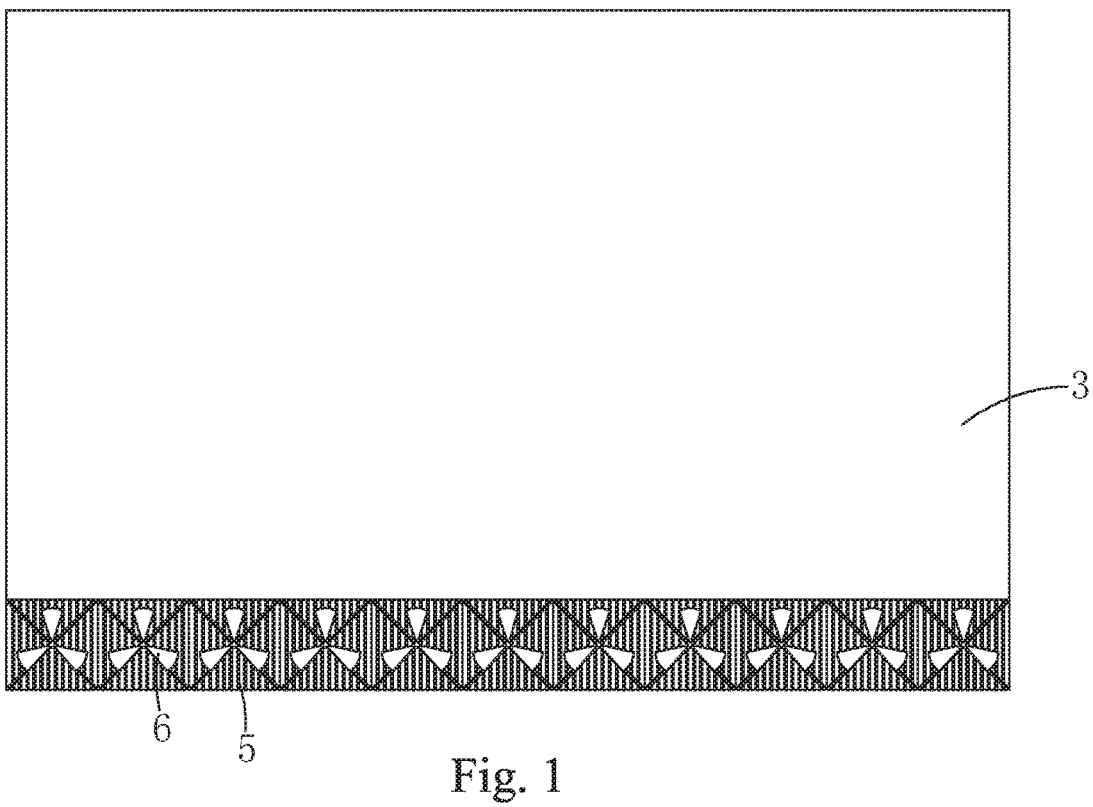
FIG. 1 is a schematic rear view illustrating a heat dissipation system of a liquid crystal television according to the present invention.
Figure 2:
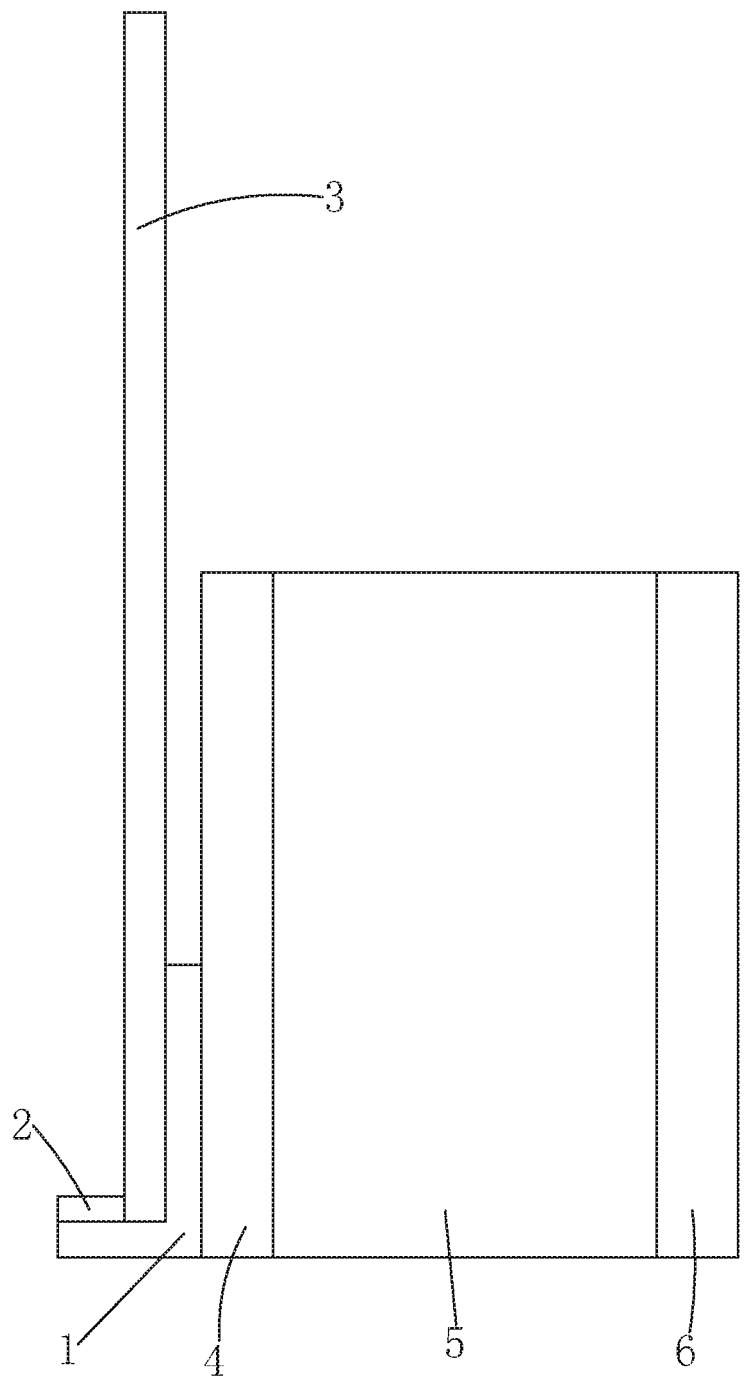
FIG. 2 is a schematic side elevational view illustrating the heat dissipation system of the liquid crystal television according to the present invention.
Figure 3:
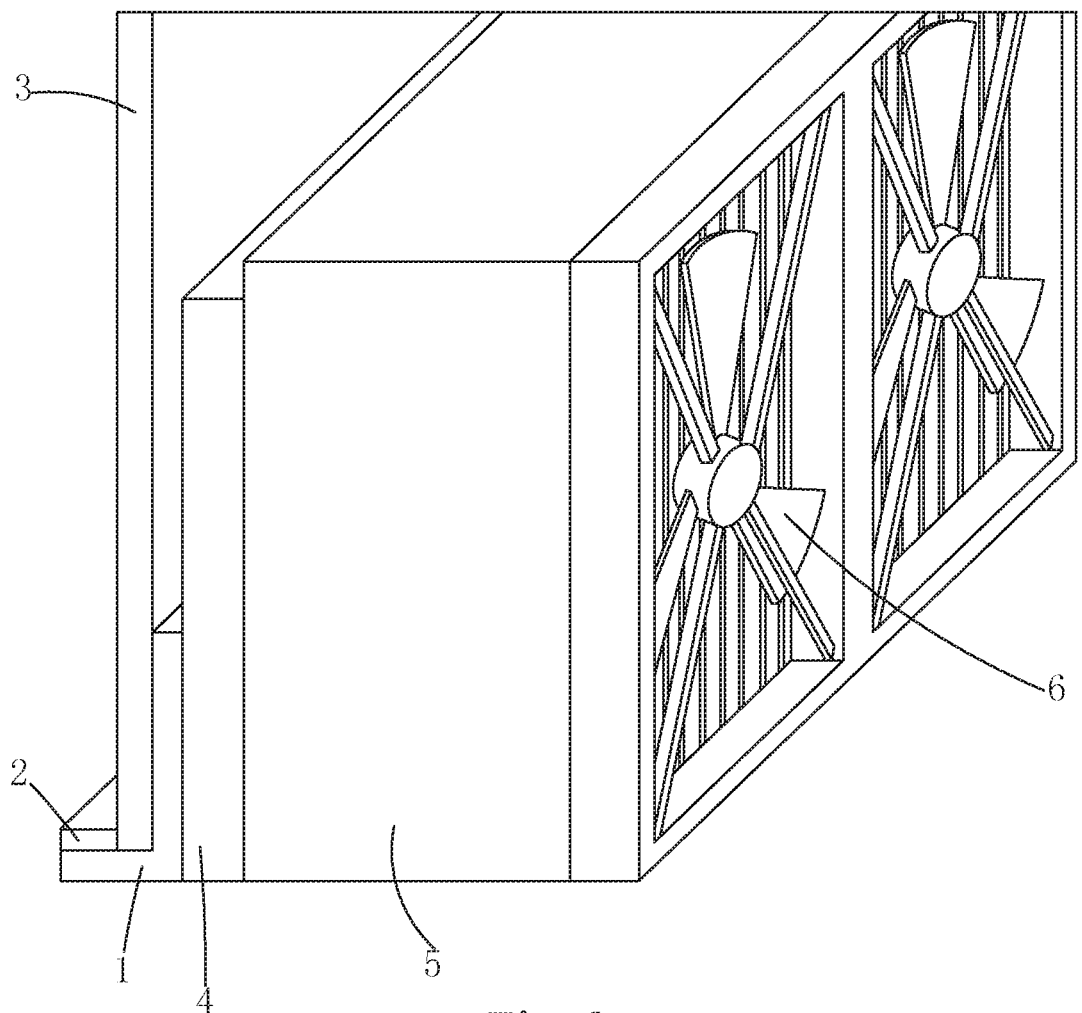
FIG. 3 is a schematic perspective rear view illustrating a portion of the heat dissipation system of the liquid crystal television according to the present invention.

Referring to FIGS. 1-3, the present invention provides a heat dissipation system for use with a liquid crystal television, which comprises a shaped heat-dissipating member 1, a light-emitting diode (LED) light bar 2, a back board 3, a heat spreader 4, heat-dissipating fins 5, and a plurality of fans 6.

The shaped heat-dissipating member 1 has an end having an L-shape. The LED light bar 2 is adhesively mounted to a horizontal bottom wall of the shaped heat-dissipating member 1 to serve as a light source for the liquid crystal television. The shaped heat-dissipating member 1 has vertical surfaces of which one that is adjacent to the LED light bar 2 is defined as an inner vertical surface, while one that is distant from the LED light bar 2 is defined as an outer vertical surface. The back board 3 is arranged between the LED light bar 2 and the inner vertical surface of the shaped heat-dissipating member 1. The shaped heat-dissipating member 1 is securely fixed to the back board 3. The heat spreader 4 is adhesively mounted to the outer vertical surface of the shaped heat-dissipating member 1. The heat-dissipating fins 5 are mounted to one side of the heat spreader 4 that is distant from the shaped heat-dissipating member 1. The plurality of fans 6 are mounted to one side of the heat-dissipating fins 5 that is distant from the heat spreader 4.

Specifically, the shaped heat-dissipating member 1 can be a traditional aluminum extrusion part, or alternatively, a shaped copper member having an L-shape and better thermal conductivity may be used as a substitute of the aluminum extrusion part.

Figure 4:
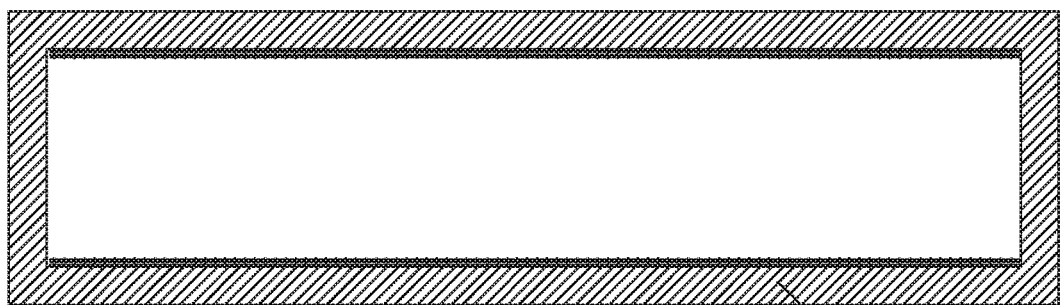
FIG. 4 is a schematic cross-sectional view illustrating a heat spreader of the heat dissipation system of the liquid crystal television according to the present invention.

The heat spreader 4 is made of a material having excellent thermal conducting property, such as copper. Referring to FIG. 4, the heat spreader 4 is made in the form of a thin plate having a hollowed interior and hollowed interior is evacuated in a partly vacuumed condition and is filled with a coolant, such as alcohol or clean water. Further, the heat spreader 4 is provided, in the interior thereof with miniature network structures. Namely, as shown in FIG. 4, the interior of the heat spreader 4 is provided with copper netting that is formed of multiple layers of miniature copper filaments extending longitudinally and laterally to interlace each other so as to greatly increase heat dissipation area. The interior of the heat spreader 4 may also be of a multiple-pore structure, meaning the interior of the heat spreader 4 is provided with a huge number of pores or micro pores, which also achieve the purpose of increasing the heat dissipation area. The heat spreader 4 operates under a principle that is similar to a heat pipe; however, the two are different in respect of the way of heat transfer, where the heat pipe transfers heat in a linear, one-dimensional fashion, while the heat spreader 4 transfers heat in a planar, two-dimensional fashion and thus provides a higher heat transfer efficiency.

An operation of the heat dissipation system of the liquid crystal television according to the present invention is as follows:

Upon activation of the liquid crystal television, the high power LED light bar 2 starts to emit light and give off a large amount of heat. The heat is first transferred, through conduction, to the shaped heat-dissipating member 1.

The heat is then conducted to the heat spreader 4, such that a heat absorption end of the heat spreader 4, which is the portion of the heat spreader 4 that is set in contact with the outer vertical surface of the shaped heat-dissipating member 1 receives the heat and the miniature network structures or the multiple-power structures provided in the interior of the heat spreader 4 quickly absorbs the heat, making the coolant quickly evaporated in the vacuumed, ultra-low pressure condition. The evaporate coolant, in a vapor form, moves to a cold end of the heat spreader 4, which is the portion of the heat spreader 4 that is in contact with the heat-dissipating fins 5, and condenses back to a liquid form of coolant. Afterwards, the liquid coolant, under the capillary effect induced by the miniature network structures or the multiple-power structures provided in the interior of the heat spreader 4, is caused to flow back to the heat absorption end, and cyclic circulation is thus established. Such a process of evaporation and condensation of the coolant realizes an effect of heat transfer and heat dissipation of extremely high efficiency by means of the vacuumed, ultralow pressure environment and an extremely large heat exchange area provided by the miniature network structures or the multiple-power structures in the interior of the heat spreader 4. Further, a projection area that the heat spreader 4 casts on the back board 3 is greater than a projection area that the shaped heat-dissipating member 1 does on the back board 3, and a height of the heat spreader 4 is greater than a height of the shaped heat-dissipating member 1 so that the arrangement of the heat spreader 4 would absorb most of the heat generated by the LED light bar 2, and compared to the traditional aluminum extrusion, could greatly reduce a temperature gradient and heighten heat dissipation efficiency.

Afterwards, the heat spreader 4 transfers the heat absorbed thereby to the heat-dissipating fins 5.

Finally, the heat is transferred to air through forced air cooling induced by the plurality of the fans 6 to thereby achieve removal of heat generated by the LED light bar 2 in a quick, massive, and efficient manner, preventing the LED light bar 2 from burning down or shortening of service life due to excessive high temperature.

Further, the heat spreader 4 functions as a core heat transfer medium in the entire heat dissipation system of the present invention. The heat spreader 4 provides a very high efficiency of heat transfer and heat dissipation and thus making it possible to reduce the size of the shaped heat-dissipating member 1 thereby facilitating thinning of the liquid crystal television.

Based on the same inventive idea, the present invention also provides a liquid crystal television, which comprises the above-discussed heat dissipation system for use with a liquid crystal television to exhibit high heat dissipation efficiency and good heat dissipation performance. The structure and operation of the heat dissipation system of the liquid crystal television will not be repeatedly described herein.

In summary, the present invention provides a heat dissipation system for use with a liquid crystal television, in which a heat spreader having high thermal conductivity is adhesively mounted to a shaped heat-dissipating member and is operated in combination with heat-dissipating fins and fans, wherein the heat spreader functions as a core heat transfer medium in the entire heat dissipation system to help greatly reduce a temperature gradient and to remove heat from an LED light bar in a quick, massive, and efficient manner so as to prevent the LED light bar from burning down or shortening of service life due to excessive high temperature. Further, due to the arrangement of the heat spreader, the size of the shaped heat-dissipating member can be reduced thereby helping thinning of the liquid crystal television. The present invention provides a liquid crystal television, which comprises the above heat dissipation system for use with a liquid crystal television and shows high heat dissipation efficiency and good heat dissipation performance.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A heat dissipation system for use with a liquid crystal television, comprising a shaped heat-dissipating member, a light-emitting diode (LED) light bar adhesively mounted to a horizontal bottom wall of the shaped heat-dissipating member, a back board arranged between the LED light bar and an inner vertical surface of the shaped heat-dissipating member to receive the shaped heat-dissipating member to fix thereto, a heat spread adhesively mounted to an outer vertical surface of the shaped heat-dissipating member, heat-dissipating fins mounted to one side of the heat spreader that is distant from the shaped heat-dissipating member, and a plurality of fans mounted to one side of the heat-dissipating fins that is distant from the heat spreader; wherein the heat spreader casts a projection area on the back board is greater than a projection area cast on the back board by the shaped heat-dissipating member and the heat spreader has a height that is greater than a height of the shaped heat-dissipating member.

2. The heat dissipation system for use with a liquid crystal television as claimed in claim 1, wherein the shaped heat-dissipating member comprises an aluminum extrusion member or a shaped copper member.

3. The heat dissipation system for use with a liquid crystal television as claimed in claim 1, wherein the heat spreader comprises a thin plate having a hollowed interior.

4. The heat dissipation system for use with a liquid crystal television as claimed in claim 3, wherein the interior of the heat spreader is evacuated and vacuumed.

5. The heat dissipation system for use with a liquid crystal television as claimed in claim 4, wherein the heat spreader is provided, in the interior thereof, with miniature network structures or a multiple-pore structure.

6. The heat dissipation system for use with a liquid crystal television as claimed in claim 5, wherein the interior of the heat spreader is filled with a coolant.

7. The heat dissipation system for use with a liquid crystal television as claimed in claim 6, wherein the coolant comprises alcohol or clean water.

8. The heat dissipation system for use with a liquid crystal television as claimed in claim 1, wherein the heat spreader is made of a material comprising copper.

9. A liquid crystal television, comprising the heat dissipation system for use with a liquid crystal television as claimed in claim 1.

10. A heat dissipation system for use with a liquid crystal television, comprising a shaped heat-dissipating member, a light-emitting diode (LED) light bar adhesively mounted to a horizontal bottom wall of the shaped heat-dissipating member, a back board arranged between the LED light bar and an inner vertical surface of the shaped heat-dissipating member to receive the shaped heat-dissipating member to fix thereto, a heat spread adhesively mounted to an outer vertical surface of the shaped heat-dissipating member, heat-dissipating fins mounted to one side of the heat spreader that is distant from the shaped heat-dissipating member, and a plurality of fans mounted to one side of the heat-dissipating fins that is distant from the heat spreader;
  wherein the shaped heat-dissipating member comprises an aluminum extrusion member or a shaped copper member;
  wherein the heat spreader comprises a thin plate having a hollowed interior; and
  wherein the heat spreader casts a projection area on the back board is greater than a projection area cast on the back board by the shaped heat-dissipating member and the heat spreader has a height that is greater than a height of the shaped heat-dissipating member.

11. The heat dissipation system for use with a liquid crystal television as claimed in claim 10, wherein the interior of the heat spreader is evacuated and vacuumed.

12. The heat dissipation system for use with a liquid crystal television as claimed in claim 11, wherein the heat spreader is provided, in the interior thereof, with miniature network structures or a multiple-pore structure.

13. The heat dissipation system for use with a liquid crystal television as claimed in claim 12, wherein the interior of the heat spreader is filled with a coolant.

14. The heat dissipation system for use with a liquid crystal television as claimed in claim 13, wherein the coolant comprises alcohol or clean water.

15. The heat dissipation system for use with a liquid crystal television as claimed in claim 10, wherein the heat spreader is made of a material comprising copper.

* * * * *